United States Patent
Onaka et al.

(10) Patent No.: US 6,270,633 B1
(45) Date of Patent: Aug. 7, 2001

(54) ARTIFICIAL LATTICED MULTI-LAYER FILM DEPOSITION APPARATUS

(75) Inventors: Kazuhiro Onaka, Neyagawa; Sumio Maekawa, Hirakata; Shigeru Yamamoto, Katano; Masafumi Okamoto, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/367,259

(22) PCT Filed: Feb. 13, 1998

(86) PCT No.: PCT/JP98/00595

§ 371 Date: Oct. 28, 1999

§ 102(e) Date: Oct. 28, 1999

(87) PCT Pub. No.: WO98/36105

PCT Pub. Date: Aug. 20, 1998

(30) Foreign Application Priority Data

Feb. 14, 1997 (JP) ........................................... 9-29906

(51) Int. Cl.[7] ................................................. C23C 14/35
(52) U.S. Cl. ................................ 204/192.12; 204/298.09; 204/298.11; 204/298.15; 204/298.17; 204/298.23; 204/298.26; 204/298.28; 204/298.29
(58) Field of Search .................... 204/192.12, 298.09, 204/298.11, 298.15, 298.17, 298.23, 298.26, 298.28, 298.29

(56) References Cited

U.S. PATENT DOCUMENTS

| | | | | |
|---|---|---|---|---|
| 4,851,095 | * | 7/1989 | Scobey et al. | 204/192.12 |
| 5,178,739 | * | 1/1993 | Barnes et al. | 204/192.12 |
| 5,240,583 | | 8/1993 | Ahonen | 204/298.04 |
| 5,441,615 | * | 8/1995 | Mukai et al. | 204/192.12 |
| 5,738,945 | * | 4/1998 | Lal et al. | 428/611 |
| 5,780,175 | * | 7/1998 | Chen et al. | 428/692 |
| 5,961,793 | * | 10/1999 | Ngan | 204/192.12 |

FOREIGN PATENT DOCUMENTS

| | | | |
|---|---|---|---|
| 1-152266 | 6/1989 | (JP) | C23C/14/24 |
| 07057933 | 3/1995 | (JP) | H01F/10/08 |
| 8-100260 | 4/1996 | (JP) | C23C/14/56 |
| 9-92908 | 4/1997 | (JP) | H01L/43/12 |

OTHER PUBLICATIONS

DL 142568 abstract, Jul. 1980.*
DL 141685 abstract, May 1980.*

* cited by examiner

*Primary Examiner*—Nam Nguyen
*Assistant Examiner*—Steven H. Ver Steeg
(74) *Attorney, Agent, or Firm*—McDermott, Will & Emery (57) ABSTRACT

The present invention relates to an artificial latticed multi-layer film deposition apparatus for depositing on a substrate a gigantic magneto-resistive effect film (GMR film) having an artificial lattice structure formed of magnetic metal films and non-magnetic metal films alternately laminated one over the other and its object is to provide the artificial latticed multi-layer film deposition apparatus to enable easy and secure deposition of an artificial latticed multi-layer film having GMR characteristics. In order to achieve the above object, an artificial latticed multi-layer film deposition apparatus of the present invention comprises a target (23) having a magnetron magnet (25) on the bottom surface thereof, a cylindrical chimney (26) covering at least the above target (23) and leaving the end thereof situated opposite to the target (23) open and a chimney top (29) that closes by sealing the end of the chimney (26) left open and also has a chimney top opening (30) on the surface thereof opposing to the target (23), in which, at the time when a substrate (33) passes above the chimney top (29), molecules are generated from the upper surface of the target (23) in the form of a plasma ring (34a, 34b) and sputtered on the substrate (33) for film deposition.

11 Claims, 7 Drawing Sheets

ARTIFICIAL LATTICED MULTI-LAYER FILM DEPOSITION APPARATUS

FIELD OF THE INVENTION

The present invention relates to an artificial latticed multi-layer film deposition apparatus for depositing on a substrate a gigantic magneto-resistive effect (referred to as "GMR" hereafter) film with an artificial lattice structure formed by alternately laminating magnetic metal films and non-magnetic metal films one over the other.

BACKGROUND OF THE INVENTION

In recent years, product development and mass production facilities development have been actively pursued with regard to a GMR film which is considered very valuable for use in a conventional high precision magnetic sensor and a reading magnetic head of HDD since the GMR film has the magnetoresistive ratio of more than four times and the sensitivity of more than five times when compared with a conventional ferromagnetic magnetoresistive effect film (referred to as "MR film" hereafter).

An artificial latticed multi-layer film deposited with GMR films has a plurality of magnetic metal films and a plurality of non-magnetic metal films formed into a multi-layer structure. More specifically, a magnetic metal layer formed of a metal alloy layer of one kind to three kinds selected from the group of ferromagnetic metal materials of Ni, Fe and Co and a non-magnetic metal layer formed of one selected from the group of Cu, Ag, Au, Ru, Cr, Pt and the like are alternately laminated one over the other with each layer thickness measuring 5 Å to 50 Å, which is less than the mean free path of electron, so as to have each respective magnetic metal layer provided with an antiparallel electron spin by having respective magnetic metal layers coupled antimagneticly via the non-magnetic metal layers and to have the electron spin changed in direction according to the external magnetic field, thereby bringing about a big differential in the mean free path of conduction electron with a resulting realization of the GMR.

Next, a description is given to an artificial latticed multi-layer film having the GMR with reference to drawings.

Figure 6:
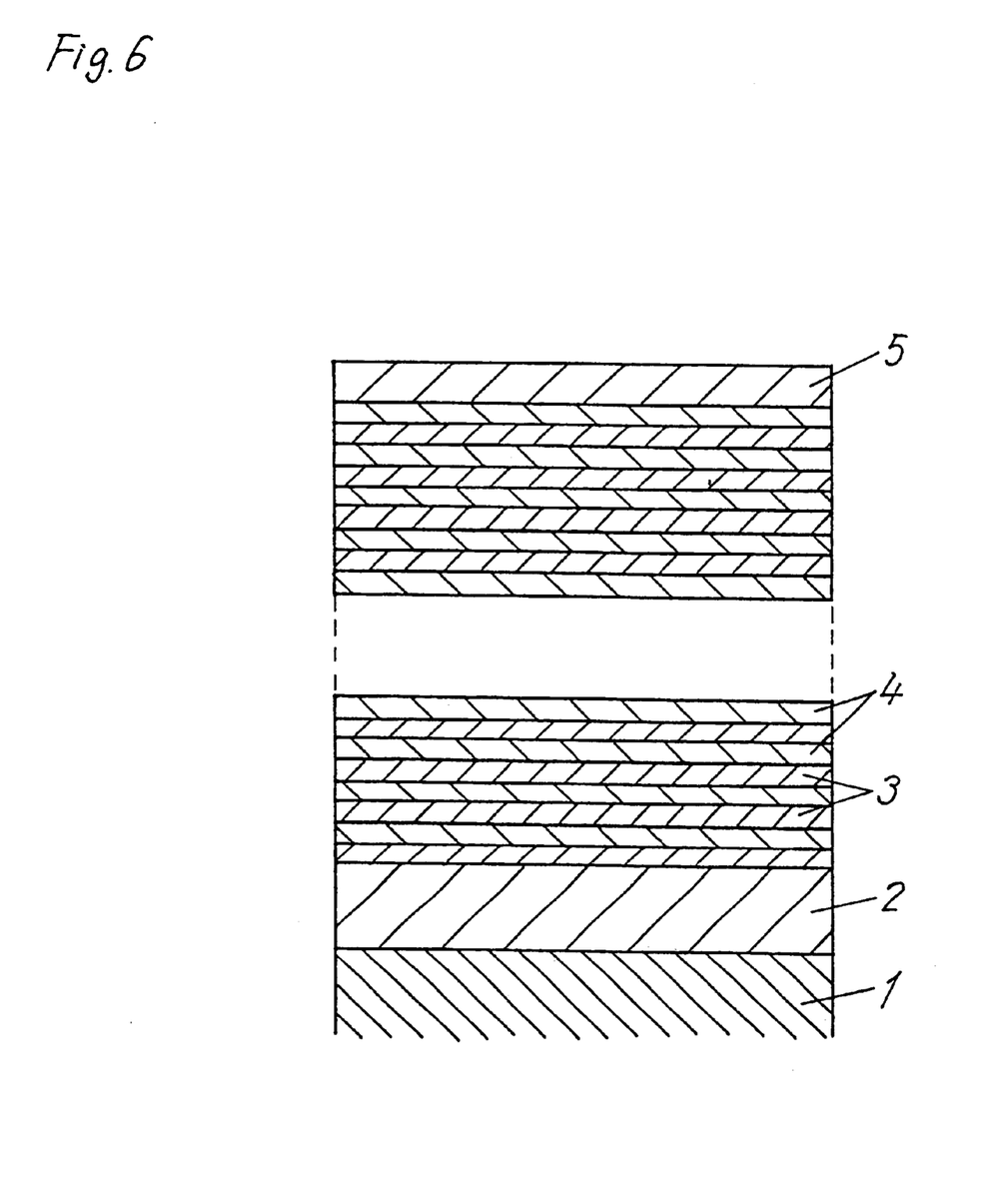
FIG. 6 is a cross-sectional view of an artificial latticed multi-layer film.

FIG. 6 is a cross-sectional view of an artificial latticed multi-layer film having the GMR Reference numeral 1 is a substrate formed of high resistance Si, glass and the like. Reference numeral 2 is a underlying metal layer of Cr, W and the like formed on the upper surface of the substrate 1 by film deposition. Reference numerals 3 and 4 are a magnetic metal layer and a non-magnetic metal layer, respectively. These layers 3 and 4 have been formed by alternately laminating respective magnetic metal films and non-magnetic metal films one over the other by film deposition according to a sputtering method up to around 15 layers of the films, respectively, with the lowest layer of the films disposed on the upper surface of the underlying metal layer 2. Reference numeral 5 is a protective film disposed on the upper surface of the non-magnetic metal layer 4 situated on the upper most surface of the magnetic metal layers 3 and non-magnetic metal layers 4 alternately laminated on the substrate 1. At this time, each respective layer of the magnetic metal layer 3 and non-magnetic metal layer 4 deposited by sputtering is allowed to present the configurations of a uniformly and smoothly formed film when compared with the layer deposited according to a method of vacuum thermal deposition employing electron beam heating or resistance heating because the kinetic energy for bombarding the material molecules onto the substrate is large. Controlling of the film thickness is easy and consistent reproducibility is possible and, therefore, the foregoing processing method is considered most appropriate in forming an artificial latticed multi-layer film having a multi-layered artificial lattice structure. Accordingly, the multi-layered films deposition by sputtering is considered one of the most promising candidate methods for the future mass production of artificial latticed multi-layer films.

Next, relative to the artificial latticed multi-layer film structured as above, a description is made on an artificial latticed multi-layer film deposition apparatus for disposing a magnetic metal layer and a non-magnetic metal layer, which form an essential part of the artificial latticed multi-layer film, by film deposition with reference to drawings.

As the prior art artificial latticed multi-layer film deposition apparatus, such an apparatus as disclosed in Japanese Patent Application Unexamined Publication No. H07-57933 is known.

Figure 7:
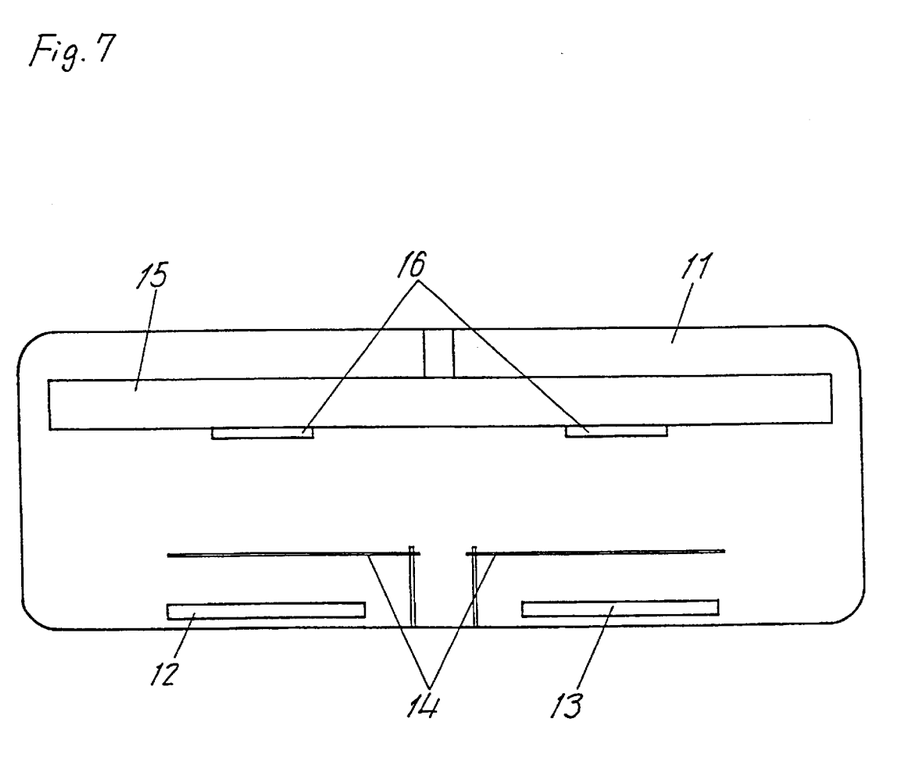
FIG. 7 is a cross-sectional view of a prior art artificial latticed multi-layer film deposition apparatus.

FIG. 7 is a schematic sketch to show the structure of a prior art artificial latticed multi-layer film deposition apparatus.

In FIG. 7, reference numeral 11 is a vacuum container. Reference numerals 12 and 13 are a Cu target and a Co target disposed on the bottom surface inside of the vacuum container 11, respectively. Reference numeral 14 is a shutter disposed by opposing to the Cu target 12 formed of a non-magnetic metallic material and the Co target 13 formed of a magnetic metallic material. Reference numeral 15 is a turntable operated by making rotatable, with one end thereof held by the upper side of the vacuum container 11 and the other end provided with a substrate holder 16 that holds a substrate (not shown in the drawing) by snapping in, thereby allowing the substrate to pass the upper surfaces of the Cu target 12 and Co target 13 alternately.

Relative to the artificial latticed multi-layer film structured as above, a description is made below on how the film deposition is performed.

First, Ar gas is introduced into the vacuum container 11 with the gas pressure maintained at about 0.5 Pa after the background vacuum of the vacuum container 11 has been adjusted to $1.3 \times 10^{-4} \sim 9 \times 10^{-4}$ Pa.

Then, the Cu target 12 formed of a non-magnetic metallic material and the Co target 13 formed of a magnetic metallic material are made to discharge at the same time, a substrate is snapped in the substrate holder 16 and the turntable 15 is rotated so that the substrate passes the upper surfaces of the Cu target and Co target alternately, thereby depositing magnetic metal layers and non-magnetic metal layers alternately for lamination.

However, with the above prior art artificial latticed multi-layer film deposition apparatus, the film deposition is performed only by passing the substrate over the upper surfaces of the Cu target and Co target, and therefore the linetic energy created is small and the sputter molecules of a gradient component involving the gas are deposited at the same time, thereby impairing the smoothness of inter-layers of the artificial latticed multi-layer film and ending up with variations in the GMR characteristics and deterioration of the performance. In order to suppress the adverse effects caused by the oxygen content, which makes one of the factors causing the variations in the characteristics, an addition of hydrogen gas to the sputter gas such as argon and the like has been tried to solve this problem. However, a great difficulty involved with maintaining the amount of hydrogen gas to be added constant and also dangers of handling hydrogen gas have prohibited the use of this method together with the problem of depositing a metal on the surface of a glass substrate or a ceramic substrate containing a metal oxide due to the reaction of a very active reduction that takes place at the time of plasma discharge in an atmosphere added with hydrogen gas.

The present invention deals with the foregoing problems involved with the prior art film deposition apparatus and aims to provide an artificial latticed multi-layer film deposition apparatus that enables the film deposition of an artificial latticed multi-layer film realizing stable GMR characteristics readily.

SUMMARY OF THE INVENTION

For the purpose of solving the foregoing problems, an artificial latticed multi-layer film deposition apparatus of the present invention comprises:

a target having a magnetron magnet on the bottom surface thereof;

a cylindrical chimney covering at least the above target and leaving the end thereof facing the target open; and a chimney top that closes by sealing the end surface of the chimney left open and also has a chimney top opening on the surface opposing to the target, in which, at the time when a substrate passes above the chimney top, molecules are generated from the upper surface of the target in the form of a plasma ring and sputtered on the substrate for film deposition.

According to the above artificial latticed multi-layer film deposition apparatus, out of the sputtered molecules for film deposition, only the molecules for film deposition concentrating on the target and having large kinetic energy are allowed to contribute to the deposition of an artificial latticed multi-layer film, thereby enabling the formation of a GMR film with a smooth layer structure.

PREFERRED EMBODIMENTS OF THE INVENTION

(First Exemplary Embodiment)

What follows is a description on an artificial latticed multi-layer film deposition apparatus in a first exemplary embodiment of the present invention with reference to drawings.

Figure 1:
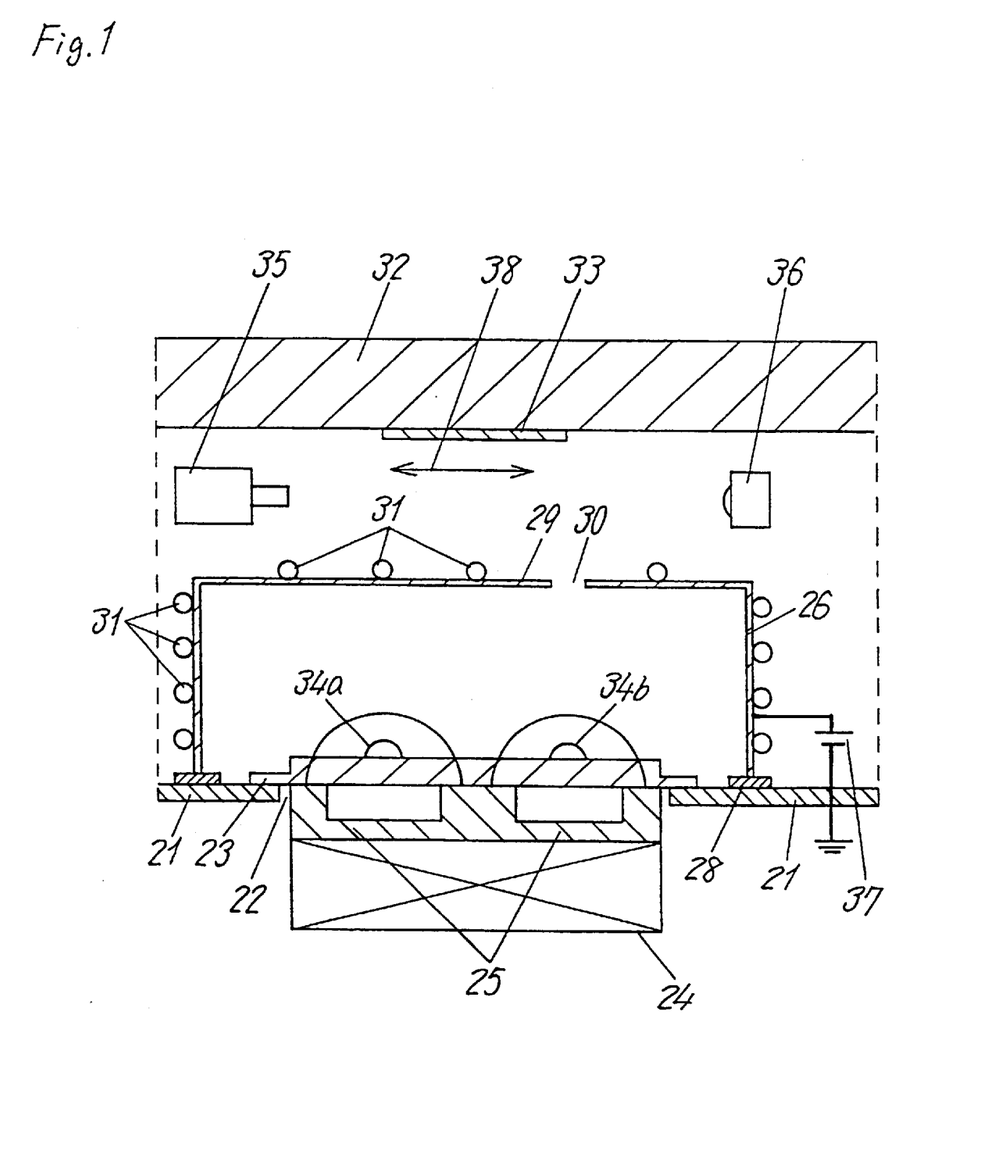
FIG. 1 is a cross-sectional view of an artificial latticed multi-layer film deposition apparatus in a first exemplary embodiment of the present invention.
Figure 2:
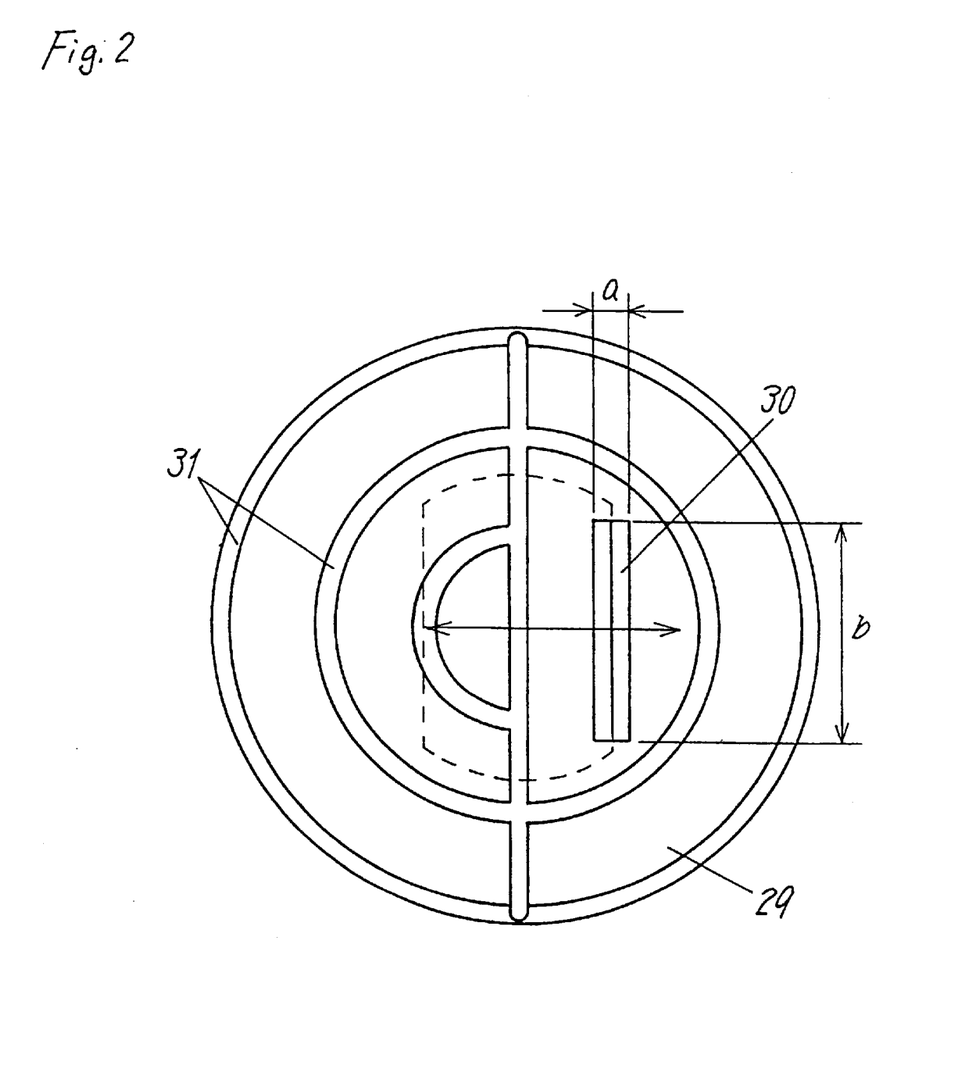
FIG. 2 is a plan view of FIG. 1 showing the vicinity of a cathode.

FIG. 1 is a cross-sectional view of the artificial latticed multi-layer film deposition apparatus in the first exemplary embodiment of the present invention. FIG. 2 is a plan view of FIG. 1 showing the vicinity of a chimney top.

In FIG. 1 and FIG. 2, reference numeral 21 is a base plate formed of a non-magnetic metal and provided with a through hole 22. Reference numeral 23 is a disc shaped target measuring about 200 mm in diameter, which is disposed so as to close the through hole 22 of the base plate 21 and comprises a magnetic metallic target (not shown in the drawing) formed of a magnetic metallic material containing at least Ni, Co, Fe and the like and a non-magnetic metallic target (not shown in the drawing) formed of a non-magnetic metallic material containing at least Cu, Ag, Ru and the like. Reference numeral 24 is a cylindrical cathode located on the bottom surface of the target 23 and fit in the through hole 22 of the base plate 21 via a doughnut-shaped magnetron magnet 25 formed of a Sm—Co family rare-earth magnet and the like, and a high DC voltage is applied to this cathode 24. Reference numeral 26 is a cylindrical chimney disposed so as to cover at least the target 23 and also provided with a ring shaped insulator 28 formed of ceramics and the like on the surface where the cylindrical chimney 26 comes into contact with the base plate 21. The cylindrical chimney 26 is formed of a non-magnetic stainless steel SUS 304 and the like and leaves the end thereof facing the target 23 formed of a non-magnetic metal open. Reference numeral 29 is a chimney top which closes the other open end of the chimney 26 and has a through hole referred to as a chimney top opening 30. The chimney top 29 is formed of a non-magnetic metal such as SUS304, a non-magnetic stainless steel, and the like. As shown in FIG. 2, the chimney top opening 30 of the chimney top 29 is configured so as to satisfy an inequality "b/a>1", where "a" is a length of the chimney top opening 30 measured in the tangent direction of the chimney top 29 and "b" is a length of the chimney top opening 30 measured in the radial direction of the chimney top 29. Reference numeral 31 shows a plurality of tubular coolant channels installed on the chimney 26 and on the surface of the chimney top 29 situated opposite to the target 23. These coolant channels 31 are formed of a non-magnetic metal and intended for keeping the temperatures of the chimney 26 and chimney top 29 constant while the target 23 is discharged. Reference numeral 32 is a dome formed of a non-magnetic metal and disposed at the side of the chimney top 29 situated opposite to the target 23. The dome 32 is provided with a mechanism (not shown in the drawings) whereby a substrate 33 formed of Si, glass and the like is held at a distance not exceeding 80 mm from the chimney top and the dome 32 is moved in parallel to at least the direction perpendicular to a straight line section of a magnetic metal plasma ring 34a and a non-magnetic metal plasma ring 34b that are generated from a magnetic metal target and a non-metal target of the target 23 to the surface thereof situated opposite to the magnetron magnet 25, respectively, when the cathode 24 is discharged, as described later. Reference numerals 35 and 36 are a photoelectric element and a photoelectric detection element, respectively, of an atomic absorption spectrometry apparatus, which are disposed between the chimney top 29 and the dome 32 and arranged in position so as to make the radiated light beam proceed in parallel with the upper surface of the chimney top opening 30. Reference numeral 37 is a constant voltage power supply to charge the chimney 26 and chimney top 29 positively.

Next, a description is made on a film deposition method using the artificial latticed multi-layer film deposition apparatus as structured above.

First, the power supply (not shown in the drawing) electrically connected to the cathode 24 is turned on to have the magnetic metal plasma ring 34a of about 0.93 W/cm$^2$ and the non-magnetic plasma ring 34b of about 0.93 W/cm² generated from the magnetic metal target and non-magnetic metal target of the target 23, respectively, thereby having made preparations for sputtering magnetic metal molecules and non-magnetic metal molecules. At this time, the distance between the target 23 and the chimney top 29 might be made large enough not to allow the chimney top 29 to touch the magnetic metal plasma ring 34a and non-magnetic metal plasma ring 34b generated from the target 23. With the first exemplary embodiment of the present invention, the above distance is set to 35 mm. The magnetic metal plasma ring 34a and non-magnetic metal plasma ring 34b generated from the target 23 are shaped like close to a trapezoid, which are made to show respectively a larger length in the moving direction 38 of the substrate 33, as described later, than a width measured in the direction perpendicular to the foregoing moving direction of the substrate 33.

Next, in the first exemplary embodiment of the present invention, the distance from the chimney top 29 to the substrate 33 is made smaller than the mean free path of the molecules that are provided as the magnetic metal plasma ring 34a and non-magnetic metal plasma ring 34b generated from the upper surface of the target 23 for sputtering. The substrate 33 with an underlying metal layer of Cr and the like deposited to a thickness of about 30 Å is mounted on the dome 32 located at a distance of 30 mm from the chimney top 29 and made to pass over the chimney top opening 30 of the chimney top 29 located above the magnetic metal target and non-magnetic metal target of the target 23 alternately, thereby laminating magnetic metal layers and non-magnetic metal layers alternately by sputtering on the outer surface of the underlying metal layer of the substrate 33. At this time, the sputtering condition requires that Ar is used as the sputtering gas, the background vacuum is $4\times10^{-5}$ Pa and the sputtering gas pressure is 0.15 Pa. Further, at the time of sputtering, a voltage of 5 V to 6V is applied to the chimney 26 and chimney top 29 from the constant voltage power supply 37. The linearity of the magnetic metal molecules and non-magnetic metal molecules that are sputtered and travel in straight lines can be enhanced, and the magnetic metal molecules and non-magnetic metal molecules do not fly slantingly, thereby enabling the deposition of an artificial latticed multi-layer film formed of smoothly surfaced magnetic metal layers and non-magnetic metal layers conforming to the underlying metal layer of the substrate 33. The deposition amount of the magnetic metal layers and non-magnetic metal layers constituting the artificial latticed multi-layer film can be controlled by measuring the quantity of sputtering molecules passing between the photoelectric element 35 and the photoelectric detection element 36 of an atomic absorption spectrometry apparatus per unit time and feeding back the measured quantity to the constant voltage power supply 37.

(Second Exemplary Embodiment)

Next, a description is made on an artificial latticed multi-layer film deposition apparatus in a second exemplary embodiment of the present invention with reference to drawings.

Figure 3:
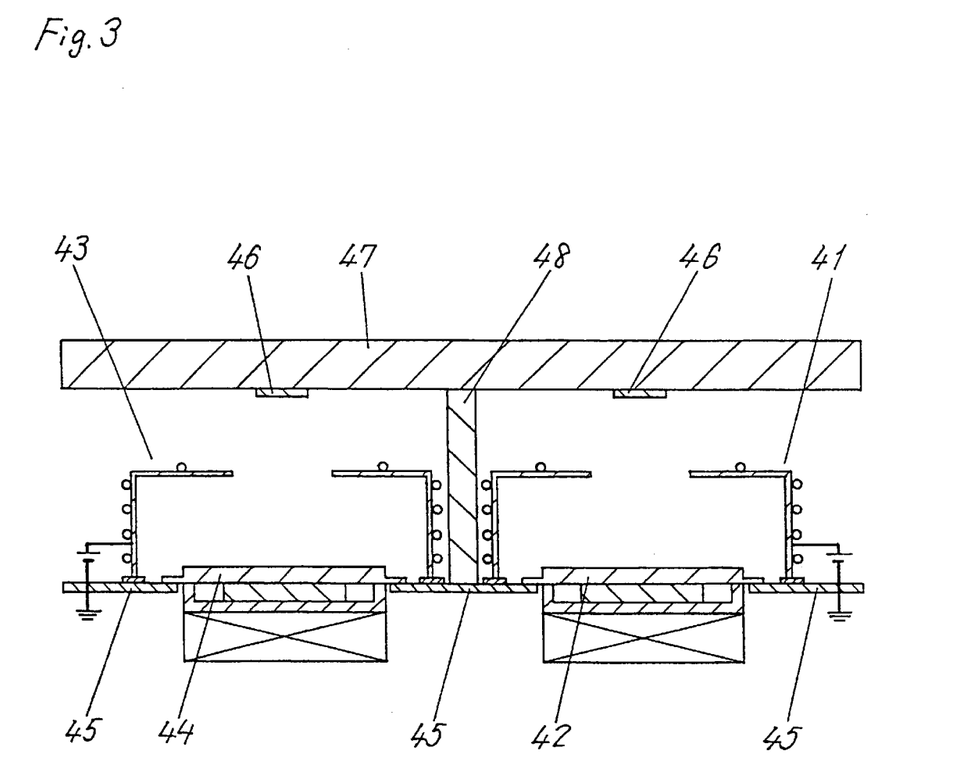
FIG. 3 is a cross-sectional view of an artificial latticed multi-layer film deposition apparatus in a second exemplary embodiment of the present invention.

FIG. 3 is a cross-sectional view of the artificial latticed multi-layer film deposition apparatus in the second exemplary embodiment of the present invention In FIG. 3, reference numeral 41 is a discharge device with almost the same structure as the artificial latticed multi-layer film deposition apparatus in the first exemplary embodiment of the present invention except for having a magnetic material target 42 only. Similarly, reference numeral 43 is a discharge device having a non-magnetic material target 44 only. Reference numeral 45 is a disc shaped base plate formed of a non-magnetic metal and the two discharge devices 41 and 43 are disposed on the disc shaped base plate 45 at the same distance from the center of the disc shaped base plate 45 with a 180-degree turn from each other. Reference numeral 46 is a substrate formed of Si or glass and reference numeral 47 is a disc shaped dome formed of a non-magnetic metal, disposed above the discharge devices 41 and 43 and in parallel with the disc shaped base plate 45 and provided with a mechanism, whereby the substrate 46 can be held with the outer surface thereof directed toward the discharge devices 41 and 43. Reference numeral 48 is a rod-like freely rotating shaft formed of a non-magnetic metal and serving as a support of the disc shaped dome 47.

Figure 4:
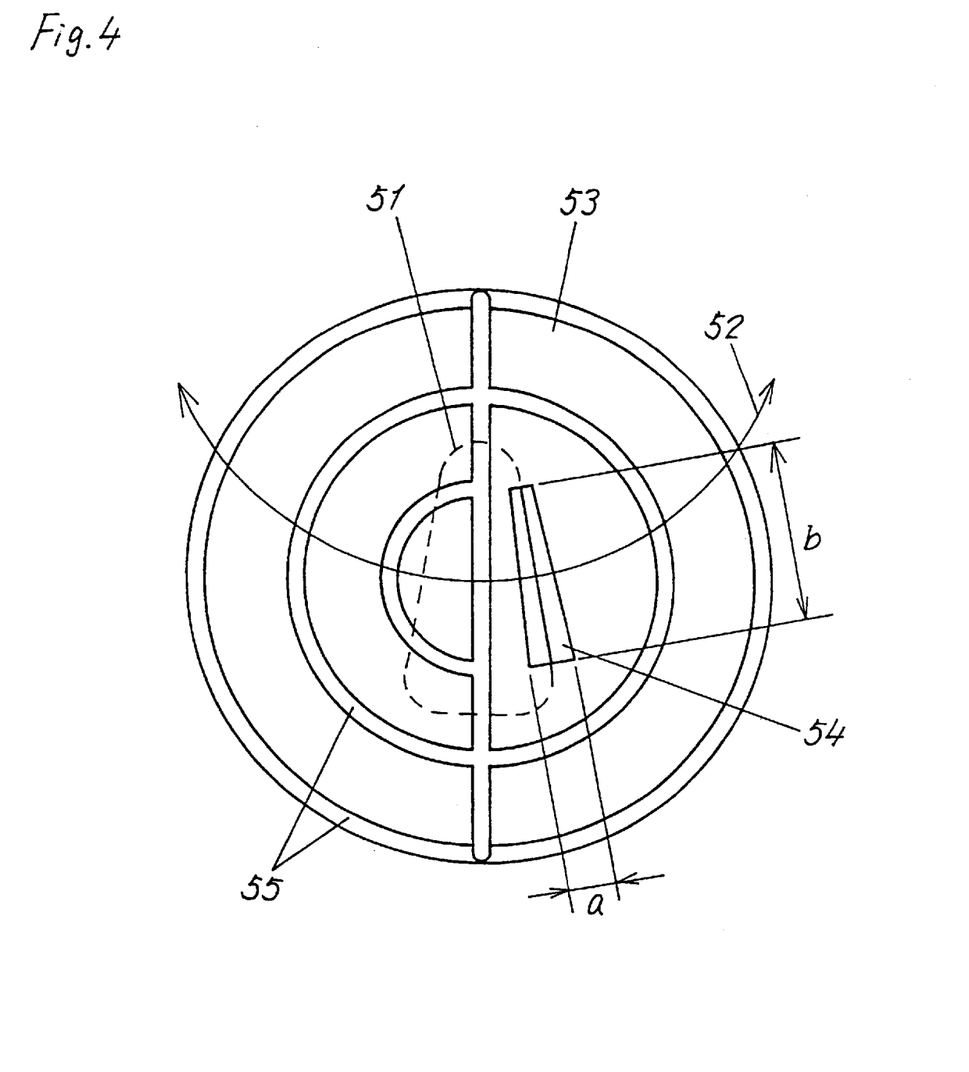
FIG. 4 is a plan view of FIG. 3 showing the vicinity of a cathode.

FIG. 4 is a plan view looking down at target surfaces of the discharge devices 42 and 44 that constitute the heart of the artificial latticed multi-layer film deposition apparatus in the second exemplary embodiment of the present invention.

As shown in FIG. 4, a plasma ring 51 is shaped almost like an isosceles trapezoid and the straight line section of a side of the plasma ring 51 is made longer than the widths thereof measured in the substrate's moving direction 52. Reference numeral 53 is a chimney top covering the targets entirely and a chimney top opening 54 is formed on the chimney top 53 in such a configuration as extending along the straight line section of the side of the plasma ring 51. Coolant channels 55 are disposed on the entire surface of the chimney top 53 in a ring like shape with respective rings almost equally spaced from one another. The relationship between the width "a" of the chimney top opening 54 at the straight line section measured in the substrate's moving direction 52 and the length "b" of the chimney top opening 54 measured in the direction perpendicular to the substrate's moving direction 52 needs to be at least satisfying an inequality of "b/a>1" and preferably satisfies an inequality of "10>b/a>2".

Figure 5:
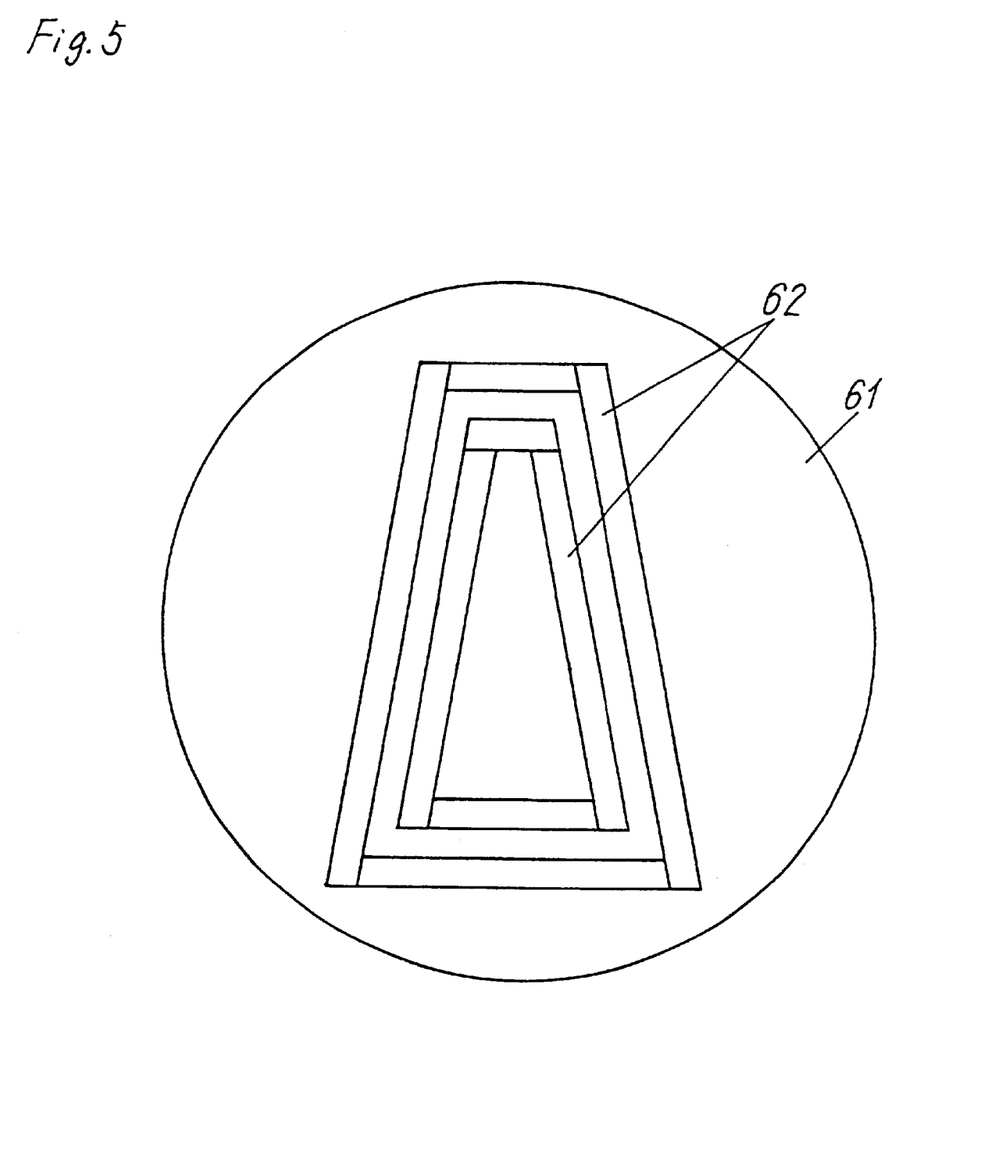
FIG. 5 is a drawing of FIG. 3 showing the positional arrangement of magnetron magnets.

FIG. 5 is a drawing of the placement of magnetron magnets to realize the configurations of the plasma ring 51 as indicated in FIG. 4. In FIG. 5, reference numeral 61 is a magnet holder formed of a non-magnetic metal for holding magnetron magnets and reference numeral 62 is a rod-like magnetron magnet formed of Sm—Co or Nd—Fe—B. Pairs of magnetron magnets 62, each pair comprising magnetron magnets different from each other in size and shape and yet disposed in parallel with each other, are arranged on the magnet holder 61 in a shape close to a trapezoid, respectively, and magnetic polarities are adjusted so as to produce magnetic fluxes in the direction perpendicular to the direction of the length of the magnetron magnets 62.

Next, a description is made on how the artificial latticed multi-layer film deposition apparatus in the second exemplary embodiment of the present invention structured as above operates.

The fundamental structure except for the shape of the discharge device's plasma ring and the sputtering conditions are the same as in the first exemplary embodiment.

The straight line section of the plasma ring 51 measures 100 mm in length, which is longer than the length of the substrate 46 measuring 51 mm. The chimney top opening 54 is formed by conforming to the configurations of the plasma ring 51 and a length "a" of the disc shaped dome 47 toward the perimeter thereof after passing the center of the substrate 46 is 20 mm and a length "b" of the disc shaped dome 47 along the radius thereof is 80 mm with an equality of "b/a=4" derived thereof. This ratio of "b/a" affects greatly the magnetic anisotropy energy value of a Ni—Fe film and at least needs to satisfy an inequality of "b/a>1", and satisfies preferably an inequality of "10>b/a>2". The dimension "a" is considered proportionate to the time required of the molecules involved to travel between respective places on the substrate 46 and the chimney top opening 54 and a due consideration is made not to allow the film thickness distribution to differ from place to place on the substrate 46. Although the magnetron magnet 62 is formed of a Sm—Co family rare earth magnet in the present exemplary embodiment, it is also possible to use a Nd—Fe—B family rare earth magnet which is inferior to the Sm—Co magnet in temperature characteristics but costs less and excels in machinability.

Film deposition of an artificial latticed multi-layer film is performed by having an Ni—Fe target and a Cu target of the discharge devices 41 and 43, respectively, discharged simultaneously and rotating the disc shaped dome 47 to pass the substrate 46 above the chimney top opening 54, thereby performing alternate deposition of films.

When only the straight line section of the plasma ring 51, which is perpendicular to the substrate's moving direction 52 as shown in FIG. 4, is used in film deposition by sputtering via the chimney top opening 54 having a fixed aspect ratio, the magnetic anisotropy energy Ku of the deposited Ni—Fe film is generated in an direction perpendicular to the tangent of the substrate's moving direction 52. In contrast, since the exchange integral J created between respective Ni—Fe films of an artificial latticed multi-layer film is isotropic, the relationship between Ku and J satisfies an inequality of Ku<J and also, when the difference in value between Ku and J is small, electron spins in each respective magnetic layer of the artificial latticed multi-layer film can be reversed readily by a minimal external magnetic field. As a result, an artificial latticed multi-layer film with high-sensitivity GMR characteristics, i.e., showing a big change in magnetoresistance by a minimal magnetic field change can be realized according to the film deposition method using the artificial latticed multi-layer film deposition apparatus as described above.

In the first exemplary embodiment of the present invention as described in the above, the adoption of the chimney top opening 30 formed on the chimney top 29 with the length "a" of the chimney top opening 30 measured in the tangent direction of the chimney top 29 and the length "b" of the chimney top opening 30 measured in the radial direction of the chimney top 29 arranged to satisfy an inequality of "b/a>1" unifies each respective direction of the axis of easy magnetization created in the plasma ring 34a, plasma ring 34b and chimney top 29, resulting in the effect of facilitating the control of the axis of easy magnetization in GMR characteristics.

The distance between the chimney top 29 and the target 23 is determined so as not to allow the plasma rings 34a and 34b generated from the target 23 to come into contact with the chimney top 29 and therefore there is no possibility that the chimney top 29 gets in contact with the plasma rings 34a and 34b, thereby having the effect of enabling secure deposition of a GMR film by sputtering.

In addition, the distance between the chimney top 29 and the substrate 33 is determined so as to be smaller than the mean free path of the molecules constituting the plasma rings 34a and 34b generated from the upper surface of the target 23 and getting sputtered and therefore there is the remotest possibility that the sputtered molecules not traveling in straight lines spread at the chimney top opening 30, thereby having the effect of making the boundary surface of a deposited GMR film smooth.

Further, the chimney 26 and chimney top 29 are formed of a non-magnetic metal, thereby having the effect of not being susceptible, to the influence of the magnetron magnet 25 and showing enhanced heat resistance, excellent machinability and also less evolution of gas at a high temperature.

Still further, the chimney 26 and chimney top 29 are provided with a cathode 24 acting as a means for applying DC positive charges thereto and therefore the sputtered molecules in the vicinity of the chimney top 29 are made repulsive with one another to realize an enhanced ability thereof to travel in stright lines by the application of the same electric charges as the sputtered molecules to the chimney 26 and chimney top 29 via the cathode 24, thereby having the effect of enabling the deposition of a GMR film with a smooth boundary surface.

The chimney 26 and chimney top 29 are provided with the coolant channel 31 as a refrigeration means and therefore forced cooling can be applied to the chimney top 29 by the circulation of a heat-transfer medium in the coolant channel 31, thereby having the effect of enabling the prevention of deformations of the cbniney top 29 due to the heat generated during the sputtering process.

Since the devices 35 and 36 constituting an atomic absorption spectrometry apparatus are disposed between the chimney top 29 and the substrate 33 for controlling the number of sputtered molecules for film deposition, the amount of the sputtered molecules can be measured during the sputtering process by an atomic absorption spectrometry method, thereby having the effect of enabling the film thickness to be controlled by calculating the film deposition rate from the foregoing measurement result of molecule count.

Further, the molecules emitted by sputtering from the target 23 include at least a magnetic metallic material selected from the group of Ni, Fe and Co and therefore magnetic anisotropy can be created arbitrarily in a direction perpendicular to the direction of the magnetron's magnetic field by forming a layer of a magnetic metal including any one of Ni, Fe and Co by sputtering in a direction slanting to the direction perpendicular to the direction of the magnetron's magnetic field, thereby having the effect of enabling the control of the sensitivity of the artificial latticed MR film deposited.

In the second exemplary embodiment of the present invention as described in the above, the configuration of the plasma ring 51 generated by the excitation of the magnetron magnet 62 is formed so as to include at least a straight line section of the plasma ring 51, which is perpendicular to the substrate's moving direction 52, and therefore magnetic anisotropy of the magnetic metal film is created in the same direction as the straight line section of the plasma ring 51, thereby having the effect of enabling the sensitivity control of GMR characteristics selectively because of the axis of easy magnetization of a GMR film formed in a direction perpendicular to the substrate's moving direction 52.

Because of the configuration of the plasma ring 51 formed on the surface of target almost like a trapezoid, when an artificial latticed multi-layer film is deposited, magnetic anisotropy is created along the sides of the trapezoid shaped plasma ring 51, thereby having the effect of facilitating the control of the axis of easy magnetization.

The chimney top opening 54 is located almost above the plasma ring 51 formed by the excitation of the magnetron magnet 62 and therefore only the film deposition molecules concentrated around the plasma ring 51, which have large kinetic energy and an excellent ability to travel in straight lines, are allowed to contribute to film deposition, thereby having the effect of enabling the formation of a GMR film having a smooth boundary surface.

The chimney top opening 54 has a configuration surrounded by two arcs, each of which has the center thereof located at the center axis of the disc shaped dome 47 and a radius different from each other, and two straight lines passing through the center axis of the disc shaped dome 47 and therefore the time required of each respective place of the substrate 46 to pass over the targets 42 and 44 via the chimney top 53 becomes the same, thereby having the effect of enabling the uniform film thickmess deposition of a GMR film at all places on the substrate 46.

The width of the chimney top opening 54 measured in the substrate's moving direction 52 increases in proportion to the speed of the substrate 46, at which the substrate 46 passes the plasma ring 51, and therefore the time required of each respective place of the substrate 46 to pass over the targets 42 and 44 via the chimney top 53 becomes the same, thereby having the effect of enabling the uniform film thickness deposition of a GMR film at all places on the substrate 46.

Further, the magnetron magnets 62 are disposed in a direction parallel to the substrate's moving direction 52 and also along the straight lines passing through the rotation shaft 48 of the disc shaped dome 47 and therefore magnetic fluxes are generated in a direction perpendicular to the direction, in which the magnetron magnets 62 are disposed by alignment, 80 as to generate the plasma ring 51 in parallel to the magnetron magnets 62 disposed as above, thereby having the effect of realizing the almost trapezoid shaped plasma ring 51.

Still further, the magnetron magnets 62 are formed of an Sm—Co family magnet or an Nd—Fe—B family magnet and when the magnetron magnets 62 are formed of an Sm—Co magnet, for example, which has a large coercive force and excellent temperature characteristics showing a smaller reduction in magnetic flux at a high temperature, the magnetron magnets 62 have the effect of stabilizing the magnetron discharge of the magnetic metal target 42. On the other hand, when the magnetron magnets 62 are formed of an Nd—Fe—B family magnet, which has a large coercive force, excellent machinability and an inexpensive price, the magnetron magnets 62 have the effect of allowing the plasma ring 51 with a complicated configuration to be generated on the magnetic metal target 42.

INDUSTRIAL USUABILITY

As described in the above, an artificial latticed multi-layer film deposition apparatus of the present invention comprises a target having a magnetron magnet on the bottom surface thereof, a cylindrical chimney covering at least the above target and leaving the end surface thereof situated opposite to the target open and a chimney top that closes by sealing the end surface of the chimney left open and also has a chimney top opening on the surface thereof opposing to the target, in which, at the time when a substrate passes above the chimney top, molecules are generated from the upper surface of the target in the form of a plasma ring and sputtered on the substrate for film deposition. Accordingly, out of the sputtered molecules for film deposition, only the molecules for film deposition concentrating on the target and having large linetic energy are allowed to contribute to the deposition of an artificial latticed multi-layer film, thereby enabling the formation of a GMR film with a smooth layer structure.

What is claimed is:
1. An artificial latticed multi-layer film deposition apparatus comprising:
a target;
a magnetron magnet disposed on a lower side of said target;
a chimney put in place covering said target, said chimney having an end left open formed at an end thereof situated opposite to said target;
a disc shaped dome disposed above said chimney; and
a substrate disposed on a lower surface of said disc shaped dome,
wherein a plasma ring is generated from an upper surface of said target by an excitation of said magnetron magnet;
said disc shaped dome is disposed in such a way as allowed to pass over said target a multiple number of times;
a configuration of said plasma ring has a straight line section perpendicular to the moving direction of said substrate; and
molecules sputtered by said plasma ring are deposited on said substrate,
wherein said plasma ring is substantially trapezoidal in shape on said upper surface of said target.
2. An artificial latticed multi-layer film deposition apparatus comprising:
a target;
a magnetron magnet disposed on a lower side of said target;
a chimney put in place covering said target, said chimney having an end left open formed at an end thereof situated opposite to said target;
a disc shaped dome disposed above said chimney; and
a substrate disposed on a lower surface of said disc shaped dome,
wherein a plasma ring is generated from an upper surface of said target by an excitation of said magnetron magnet;
said disc shaped dome is disposed in such a way as allowed to pass over said target a multiple number of times;
a configuration of said plasma ring has a straight line section perpendicular to the moving direction of said substrate;
molecules sputtered by said plasma ring are deposited on said substrate,
a chimney top disposed between said chimney and said substrate so as to close by sealing said end of chimney left open, wherein said disc shaped dome is made rotatable around a center axis thereof, said substrate moves by following a circular path centered around said center axis as said disc shaped dome rotates, and said chimney top has a chimney top opening formed at a position opposing to said target; and
a configuration of said chimney top opening is formed by being surrounded with two arcs, each having a radius different from the other and having a same center as the other with said center coinciding with the center axis of said disc shaped dome, and with two straight lines passing said center axis of said disc shaped dome,
wherein a relationship between a length "a" measured in a direction tangent to the moving direction of said substrate and a length "b" measured in a radial direction of the moving direction of said substrate satisfies an inequality of "b/a>1".

3. An artificial latticed multi-layer film deposition apparatus comprising:

a target having an upper surface;

a magnetron magnet disposed on a lower side of said target;

a chimney put in place covering said target, said chimney having an end left open formed at an end thereof situated opposite to said target;

a chimney top put in place sealing said end left open; and a substrate disposed above an upper side of said chimney top, wherein said chimney top has a chimney top opening formed at a position opposite to said target;

said substrate is disposed in such a way as allowed to pass over said chimney top opening a multiple number of times;

a plasma ring is generated from the upper surface of said target by an excitation of said magnetron magnet, wherein said plasma ring does not touch said chimney top; and molecules sputtered by said plasma ring pass through said chimney top opening and are deposited on said substrate, wherein a distance between said chimney top and said substrate is shorter than a mean free path of said molecules.

4. An artificial latticed multi-layer film deposition apparatus comprising:

a target having an upper surface;

a magnetron magnet disposed on a lower side of said target;

a chimney put in place covering said target, said chimney having an end left open formed at an end thereof situated opposite to said target;

a chimney top put in place sealing said end left open; and a substrate disposed above an upper side of said chimney top, wherein said chimney top has a chimney top opening formed at a position opposite to said target;

said substrate is disposed in such a way as allowed to pass over said chimney top opening a multiple number of times;

a plasma ring is generated from the upper surface of said target by an excitation of said magnetron magnet, wherein said plasma ring does not touch said chimney top; and molecules sputtered by said plasma ring pass through said chimney top opening and are deposited on said substrate; and means for applying DC positive charges to said chimney and chimney top.

5. An artificial latticed multi-layer film deposition apparatus comprising:

a target having an upper surface;

a magnetron magnet disposed on a lower side of said target;

a chimney put in place covering said target, said chimney having an end left open formed at an end thereof situated opposite to said target;

a chimney top put in place sealing said end left open; and a substrate disposed above an upper side of said chimney top, wherein said chimney top has a chimney top opening formed at a position opposite to said target;

said substrate is disposed in such a way as allowed to pass over said chimney top opening a multiple number of times;

a plasma ring is generated from the upper surface of said target by an excitation of said magnetron magnet, wherein said plasma ring does not touch said chimney top; and molecules sputtered by said plasma ring pass through said chimney top opening and are deposited on said substrate; and means for cooling said chimney and chimney top.

6. An artificial latticed multi-layer film deposition apparatus comprising:

a target having an upper surface;

a magnetron magnet disposed on a lower side of said target;

a chimney put in place covering said target, said chimney having an end left open formed at an end thereof situated opposite to said target;

a chimney top put in place sealing said end left open; and a substrate disposed above an upper side of said chimney top, wherein said chimney top has a chimney top opening formed at a position opposite to said target;

said substrate is disposed in such a way as allowed to pass over said chimney top opening a multiple number of times;

a plasma ring is generated from the upper surface of said target by an excitation of said magnetron magnet, wherein said plasma ring does not touch said chimney top; and molecules sputtered by said plasma ring pass through said chimney top opening and are deposited on said substrate; and an atomic absorption spectrometry apparatus, which is installed between said chimney top and said substrate and has a function of controlling a number of said molecules.

7. An artificial latticed multi-layer film deposition apparatus comprising:

a target;

a magnetron magnet disposed on a lower side of said target;

a chimney put in place covering said target, said chimney having an end left open formed at an end thereof situated opposite to said target;

a disc shaped dome disposed above said chimney; and a substrate disposed on a lower surface of said disc shaped dome, wherein a plasma ring is generated from an upper surface of said target by an excitation of said magnetron magnet;

said disc shaped dome is disposed in such a way as allowed to pass over said target a multiple number of times;

a configuration of said plasma ring has a straight line section perpendicular to the moving direction of said substrate;

molecules sputtered by said plasma ring are deposited on said substrate, and an atomic absorption spectrometry apparatus, which is installed between said chimney and said disc shaped dome and has a function of controlling a number of said molecules.

8. An artificial latticed multi-layer film deposition apparatus comprising:
   a target;
   a magnetron magnet disposed on a lower side of said target;
   a chimney put in place covering said target, said chimney having an end left open formed at an end thereof situated opposite to said target;
   a disc shaped dome disposed above said chimney; and
   a substrate disposed on a lower surface of said disc shaped dome,
   wherein a plasma ring is generated from an upper surface of said target by an excitation of said magnetron magnet;
   said disc shaped dome is disposed in such a way as allowed to pass over said target a multiple number of times;
   a configuration of said plasma ring has a straight line section perpendicular to the moving direction of said substrate; and
   molecules sputtered by said plasma ring are deposited on said substrate, wherein said plasma ring forms a substantially trapezoidal shape on said upper surface of said target; and
   said magnetron magnet is disposed in parallel to a moving direction of said substrate and also disposed along a straight line passing a rotation shaft of said disc shaped dome.

9. A production method of an artificial latticed multi-layer film comprising the steps of:
   (a) providing a film deposition apparatus having:
      a target,
      a magnetron magnet disposed on a lower side of said target, and
      a chimney put in place covering said target, said chimney having an end left open formed at an end thereof situated opposite to said target;
   (b) disposing a substrate above an upper side of a chimney top opening formed on said end left open at a position opposing to said target;
   (c) generating a plasma ring from an upper surface of said target by an excitation of said magnetron magnet, wherein said plasma ring does not touch said chimney top; and
   (d) depositing molecules sputtered by said plasma ring and passed through said chimney top opening on said substrate while said substrate is passing over the upper side of said chimney top opening a multiple number of times;
   wherein said film deposition apparatus furter comprises a disc shaped dome disposed above an upper side of said chimney, said substrate is disposed on a lower surface of said disc shaped dome; and at said step (c), said plasma ring is generated so as to have a configuration with a straight line section perpendicular to a moving direction of said substrate, and
   wherein said film deposition apparatus further comprises a chimney top disposed between said chimney and said substrate so as to seal said end left open;
   said chimney top has a chimney top opening formed thereon at a position opposite to said target;
   a configuration of said chimney top opening is formed by being surrounded with two arcs, each having a radius different from the other and having same center as the other with said center coinciding with a center axis of said disc shaped dome, and with two straight lines passing said center axis of said disc shaped dome; and
   at said step (d), said disc shaped dome rotates by centering around the center axis thereof; and
   said substrate moves by following a circular path centered around said center axis as said disc shaped dome rotates.

10. The production method of an artificial latticed multi-layer film according to claim 9,
   wherein said substrate moves at a variable speed; and
   a width of said chimney top opening measured in a moving direction of said substrate increases in proportion to the moving speed of said substrate.

11. A production method of an artificial latticed multi-layer film comprising the steps of:
   (a) providing a film deposition apparatus having:
      a target,
      a magnetron magnet disposed on a lower side of said target, and
      a chimney put in place covering said target, said chimney having an end left open formed at an end thereof situated opposite to said target;
   (b) disposing a substrate above an upper side of a chimney top opening formed on said end left open at a position opposing to said target;
   (c) generating a plasma ring from an upper surface of said target by an excitation of said magnetron magnet, wherein said plasma ring does not touch said chimney top; and
   (d) depositing molecules sputtered by said plasma ring and passed through said chimney top opening on said substrate while said substrate is passing over the upper side of said chimney top opening a multiple number of times;
   wherein said film deposition apparatus fbrther comprises a disc shaped dome disposed above the upper side of said chimney;
   said substrate is disposed on a lower surface of said disc shaped dome;
   said magnetron magnet is disposed in parallel to a moving direction of said substrate and also disposed along a straight line passing a rotation shafi of said disc shaped dome; and
   at said step (c), said plasma ring is generated substantially trapezoidal in shape on said upper surface of said target and including a straight line section perpendicular to a moving direction of said substrate.

* * * * *